United States Patent [19]
Nakanishi

[11] Patent Number: 5,245,193
[45] Date of Patent: Sep. 14, 1993

[54] MICROMECHANICS FORMING METHOD AND MICROMECHANICS

[75] Inventor: Hiroaki Nakanishi, Otsu, Japan

[73] Assignee: Shimaduzu Corporation, Kyoto, Japan

[21] Appl. No.: 683,013

[22] Filed: Apr. 10, 1991

[30] Foreign Application Priority Data

Apr. 11, 1990 [JP] Japan .................................. 2-97364

[51] Int. Cl.⁵ .......................................... H01J 37/317
[52] U.S. Cl. .................................................. 250/492.2
[58] Field of Search ........................... 250/492.21, 398

[56] References Cited
U.S. PATENT DOCUMENTS 4,371,421 2/1983 Fan et al. .............................. 156/624
4,575,180 3/1986 Chang .................................. 156/643
4,859,278 8/1989 Choi .................................... 156/653
4,869,781 9/1989 Euen et al. ........................... 156/643
5,041,361 8/1991 Tsuo .................................. 250/492.21
5,123,975 6/1992 Irinoda et al. ....................... 156/604

Primary Examiner—Bruce C. Anderson
Attorney, Agent, or Firm—Armstrong, Westerman, Hattori, McLeland & Naughton

[57] ABSTRACT

A new method for forming on a substrate such micomechanics as a micro link mechanism by means of micromachining. The new method includes a process of implanting carbon ions to improve frictional properties of at least a slidable portion of the micromechanics formed. Micomechanics having their slidable portion made of a compound of silicon and such a dopant as carbon.

2 Claims, 2 Drawing Sheets

CARBON IONS

MICROMECHANICS FORMING METHOD AND MICROMECHANICS

BACKGROUND OF THE INVENTION

The present invention relates to a micromechanics forming method and micromechanics formed on a semiconductor substrate.

Micromechanics such as micro link mechanisms and micro motors are formed on a silicon substrate by means of micro-machining technology including a low-pressure CVD (chemical vapor deposition) method, photolithography and others commonly used in the process of manufacturing a semiconductor device. In forming micromechanics it is essentially important to constitute their sliding portions with a material having as excellent frictional characteristics as possible, because not only friction itself but also heat generation due to the friction impair the life time and performance of the micromechanics. Conventionally the sliding portions have been often made of single-crystalline silicon or of polycrystalline silicon thin film or silicon nitride thin film in consideration of the above. However, the sliding portions made of these materials have their characteristics of friction left room for improvement.

OBJECTS AND SUMMARY OF THE INVENTION

The present invention aims at improving the frictional characteristics at the sliding portions of micromechanics, and makes it an object to provide an improved micomechanics-forming method enabling formed micromechanics to have their sliding portions made of a material having as good physical properties as those of silicon carbide, which is very excellent in hardness, anti-abrasiveness, high thermal conductivity, low thermal expansion and resistance to thermal shock and oxidation.

Another object of the present invention is to provide micromechanics having their sliding portions improved as to the characteristics of friction.

The improved micromechanics-forming method according to the present invention, which contains conventional processes such as photolithography and low-pressure CVD, is fundamentally characterized by having a process of adding a dopant substance such as carbon partially to the material forming micromechanics, for instance, by means of ion implantation.

The micromechanics according to the present invention have their sliding portions made of a compound of silicon and a dopant such as carbon.

BRIEF DESCRIPTION OF THE DRAWINGS

In the following the present invention is described in further detail on reference to the accompanying drawings, in which.

DETAILED DESCRIPTION OF THE INVENTION

Figure 1A:
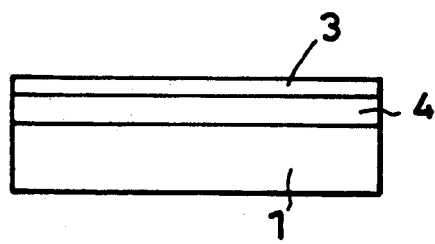
FIG. 1A-H illustrates the micromechanics forming process according to an embodiment of the present invention.
Figure 1E:
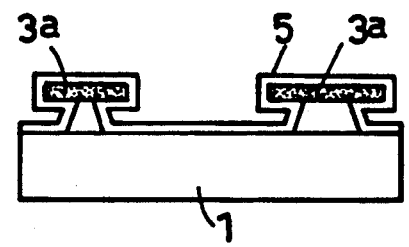
Figure 1B:
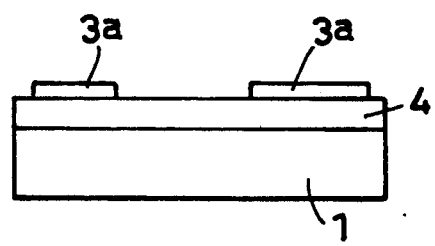
Figure 1F:
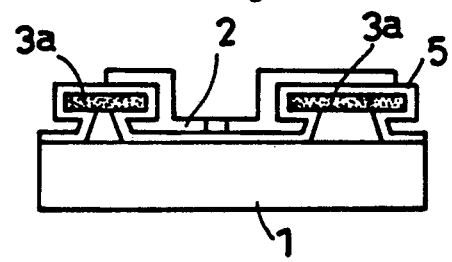
Figure 1C:
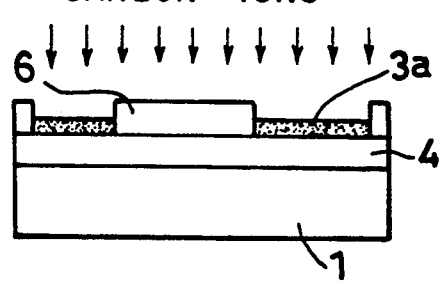
Figure 1G:
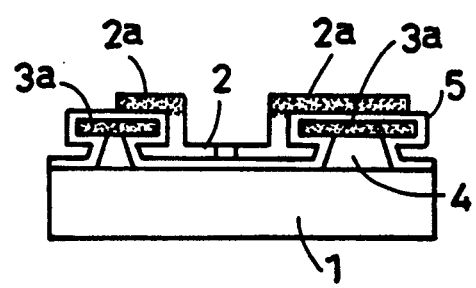
Figure 1D:
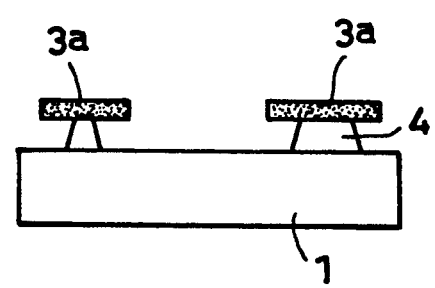
Figure 1H:
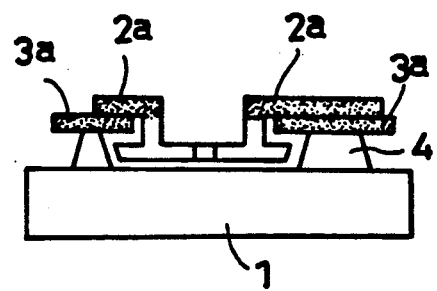

A process of forming a micro link mechanism as an example of micromechanics is described according to FIG. 1, in which the process is illustrated dividedly into eight aspects A to H corresponding to eight steps (a) to (h) into which the process is provisionally divided for convenience' sake.

Steps (a) and (b): First, after a $SiO_2$ film 4 and a polycrystalline Si film 3 are deposited, in the order named, on a Si substrate 1 by means of low-pressure CVD method (aspect A), the polycrystalline, Si film 3 is photolithographed so as to form a predetermined pattern 3a (aspect B). The thickness of the polycrystalline Si film deposition is, for example 1 to 2 $\mu$m.

Step (c): Then, with a photoresist mask 6 applied so as to expose only the above patterned polycrystalline Si film 3a, carbon ions are implanted into this patterned Si film 3a as indicated with dots in aspect C.

Step (d): Next, after the photoresist mask 6 is removed, the $SiO_2$ film 4 is etched off excluding partially the portion supporting the patterned Si film 3a (aspect D). In etching the $SiO_2$ film 4 it is important to use an etchant which exhibits a high etching rate only in $SiO_2$, because the patterned Si film 3 must be kept unetched. Fluoric acid is a good recommendation for such an etchant.

Step (e): The above structure formed in step (d) is uniformly covered with a $SiO_2$ film 5 deposited thereon by means of low-pressure CVD method (aspect E).

Step (f): Then, a polycrystalline Si film structure 2 such as shown in aspect F is formed on the above structure (obtained in step (e)) by means of low-pressure CVD method and photolithography.

Step (g): Following step (f), carbon ions are implanted, in a similar manner as used in step (c), only to part 2a of the Si film structure 2, which part 2a confronts (through the $SiO_2$ film 5) the patterned Si film 3a into which carbon ions are already injected in step (c) (step G).

Step (h): Finally, the $SiO_2$ film 5 is etched off to make the part 2a of the Si film structure 2 comes into direct contact with the patterned Si film 3a, as is shown in aspect H.

Figure 2:
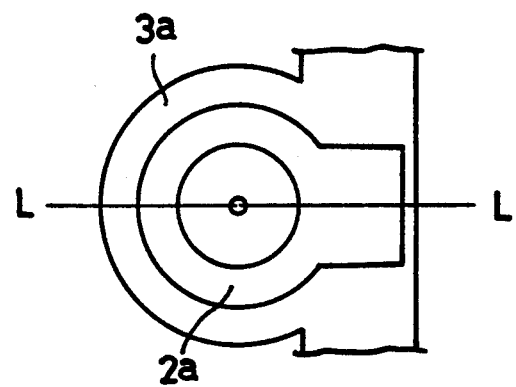
FIG. 2 shows a plan view of a micro link mechanism formed in accordance with the process illustrated in FIG. 1.

A micro link mechanism is thus obtained, whose plan view is given in FIG. 2, in which a line L—L shows that the cross-sectional view taken along the line coincides with aspect H in FIG. 1. In this link mechanism the patterned Si film 3a serves as a ring-shaped flat bearing on which the part 2a of the Si film structure 2 can smoothly rotate.

The $SiO_2$ films 4 and 5 used as separation layers in the above process can be replaced with PSG (phospho-silicate glass) films.

Figure 3:
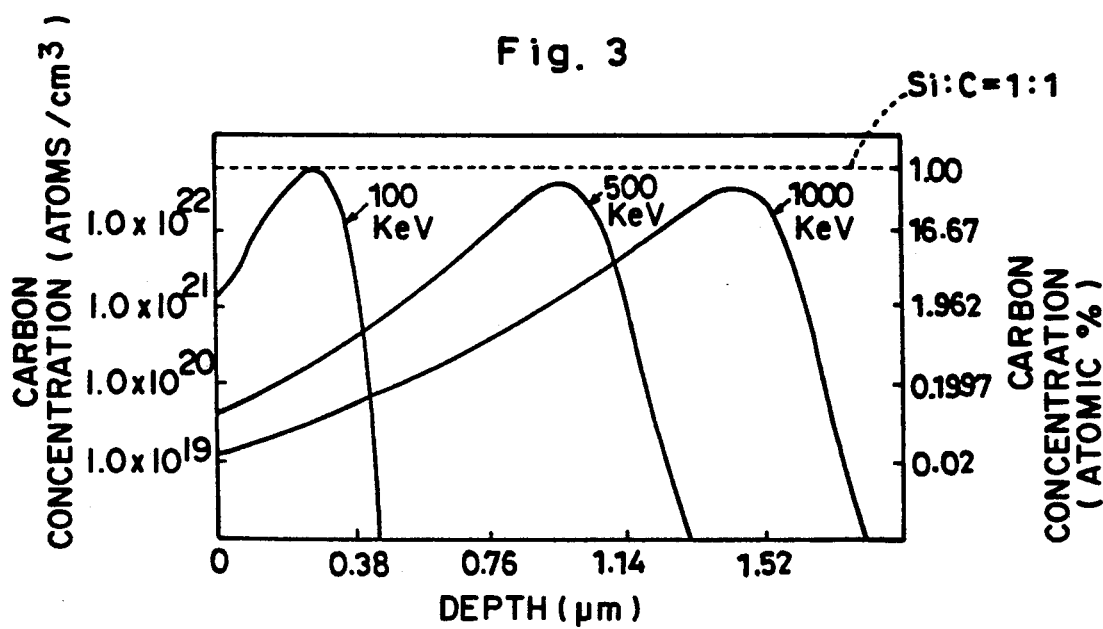
FIG. 3 shows the concentration distribution of carbon injected into a silicon film at various energies by means of ion injection.

Next, the feature of the carbon ion implantation to be employed at steps (c) and (g) is briefed in the following. If carbon ions are implanted into a 1.6 $\mu$m thick polycrystalline Si film at a dose of $1 \times 10^{18}$ ions/cm$^2$ with three different acceleration energies of 100 keV, 500 keV and 1000 keV, three carbon concentration curves as shown in FIG. 3 are obtained with respect to the depth of the Si film. These curves indicate that, if carbon ions are implanted at the above three acceleration energies, the relative concentration of carbon to silicon reaches approximately 1:1 substantially throughout the entire depth of the Si film including the surface, middle and bottom regions. The Si film is thus converted to a film made of SiC (silicon carbide) or of a material having physical properties substantially equal to those of SiC.

Therefore, the micromechanics forming method according to the present invention makes it possible to improve the slidable parts of micromechanics so as to have excellent physical properties nearly equal to those of SiC, which is excellent in such physical and chemical properties as hardness, high thermal conductivity, low thermal expansibility, anti-abrasiveness, resistance to thermal shock and anti-oxidation resistance. Further, the carbon concentration variation in the depth direction of the Si film can be varied by controlling the dose of carbon ions in conjunction with ion acceleration energy. Improvement of Si film quality can therefore be achieved at any depth of the film.

In the above method described according to FIG. 1, the Si film quality improvement by means of implanting carbon ions can be restricted at shallow surface regions in the ring-shaped bearing portion 3a and the part 2a of the film structure 2. Further, the carbon ions implantation can be performed in advance of patterning the above horizontal projections 3a and 2a by implanting carbon ions, after the polycrystalline Si films 3 and 2 have been formed respectively, with a suitable mask applied so as to mask the areas other than where the projections 3a and 2a are to be patterned later.

The dopant, which is carbon in the present embodiment, is not necessarily restricted to carbon, but may be other elements such as nitrogen, oxygen, boron and phosphorus, if they can be added to a polycrystalline Si film by means of ion implantation to improve the physical properties of the film.

Further, the addition of dopant is not necessarily by means of ion implantation. The doping may be achieved, if possible, in any other way such as diffusion.

If it is necessary to improve the quality of a Si substrate itself, carbon or any other suitable dopant may be implanted into the substrate, or the Si substrate may be replaced with a SiC substrate.

Figure 4:
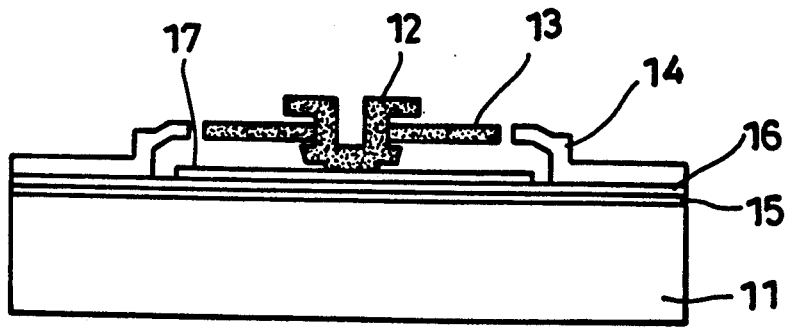
FIG. 4 shows a cross-sectional view of a piece of micro-mechanics according to the present invention.

FIG. 4 shows a cross-sectional view of a micromotor formed as an example of micromechanics based on the present invention.

Referring to FIG. 4, a $SiO_2$ layer 15 and a $Si_3N_4$ layer 16 are deposited, in the order named, on a Si substrate 11. On the $Si_3N_4$ layer 16 there are formed a stator 14 and a base layer 17 made of polycrystalline Si. The base layer 17 bares thereon a shaft 12 inserted in a rotor 13. Both the shaft 12 and the rotor 13 are made of SiC, which is excellent, as is mentioned previously, in frictional characteristics such as anti-abrasiveness. Therefore, the thus formed micromotor has its performance, anti-abrasiveness and life time improved largely in comparison with conventional micromotors.

The formation of the shaft 12 and the rotor 13 made of SiC can be achieved by applying, after these members have been formed of polycrystalline Si by means of usual micromachining the carbon ion injection technique used in the micomechanics forming method previously described according to the present invention. In this case, it possible for the shaft 12 and the rotor 13 to have only their sliding portions made of SiC.

According to another method for forming these members 12 and 13 made of SiC, they can be formed also by directly photolithographing SiC films.

This embodied micrometer can be modified by using SiC also in the stator 14.

I claim:

1. A method for forming micromechanics on a substrate wherein the micromechanics has a sliding portion, said method comprising:
   accelerating ion dopant at an acceleration energy of at least one level in the range of 100 KeV to 1000 keV inclusive, and implanting said ion dopant into said sliding portion of the micromechanics.

2. A method according to claim 1, wherein the dopant is implanted at three steps with different acceleration energies of 100 keV, 500 keV and 1000 keV.

* * * * *

UNITED STATES PATENT AND TRADEMARK OFFICE
CERTIFICATE OF CORRECTION

PATENT NO. : 5,245,193
DATED : September 14, 1993
INVENTOR(S) : Hiroaki Nakanishi It is certified that error appears in the above-indentified patent and that said Letters Patent is hereby corrected as shown below:

On the cover page, Item [73], "Shimaduzu Corporation" should read --Shimadzu Corporation--.

Signed and Sealed this

Twenty-seventh Day of September, 1994

Attest:

BRUCE LEHMAN

Attesting Officer

Commissioner of Patents and Trademarks